United States Patent
Hwang (10) Patent No.: US 10,511,292 B2
(45) Date of Patent: Dec. 17, 2019

(54) OSCILLATOR

(71) Applicant: SK hynix Inc., Gyeonggi-do (KR)

(72) Inventor: Min Soon Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 126 days.

(21) Appl. No.: 15/808,132

(22) Filed: Nov. 9, 2017

(65) Prior Publication Data

US 2018/0351508 A1 Dec. 6, 2018

(30) Foreign Application Priority Data

Jun. 2, 2017 (KR) .......................... 10-2017-0069192

(51) Int. Cl.
| | |
|---|---|
| *H03K 3/03* | (2006.01) |
| *H03L 7/099* | (2006.01) |
| *H03K 19/094* | (2006.01) |
| *H03K 3/011* | (2006.01) |
| *H03M 1/74* | (2006.01) |

(52) U.S. Cl.
CPC .......... *H03K 3/0315* (2013.01); *H03K 3/011* (2013.01); *H03K 19/09425* (2013.01); *H03L 7/0991* (2013.01); *H03L 7/0995* (2013.01); *H03L 2207/50* (2013.01); *H03M 1/745* (2013.01)

(58) Field of Classification Search
CPC ... H03K 3/0315; H03L 7/0995; H03L 7/0991; H03M 1/745
See application file for complete search history.

(56) References Cited

U.S. PATENT DOCUMENTS

| | | | |
|---|---|---|---|
| 7,495,488 B2 * | 2/2009 | Kim ...................... | H03L 7/0812 |
| | | | 327/141 |
| 10,164,649 B2 * | 12/2018 | Tsai ........................ | H03L 7/087 |

FOREIGN PATENT DOCUMENTS

| | | |
|---|---|---|
| KR | 1020100127789 | 12/2010 |
| KR | 1020160120644 | 10/2016 |

* cited by examiner

*Primary Examiner* — Ryan Johnson
(74) *Attorney, Agent, or Firm* — IP & T Group LLP (57) ABSTRACT

Disclosed is an oscillator including: a digital to analog converter configured to convert a received control code into an analog voltage and output the converted analog voltage; a mirror circuit configured to adjust a current of a common output node to which the analog voltage is applied; and a periodic signal output circuit configured to output a periodic signal having a frequency according to the analog voltage, in which the digital to analog converter, the mirror circuit, and the periodic signal output circuit are implemented with tri-state inverters.

20 Claims, 5 Drawing Sheets

OSCILLATOR

CROSS-REFERENCE TO RELATED APPLICATION

The present application claims priority under 35 U.S.C. § 119(a) to Korean patent application number 10-2017-0069192, filed on Jun. 2, 2017, the entire disclosure of which is herein incorporated by reference.

BACKGROUND

Field of Invention

The present disclosure relates to an oscillator, and more particularly, to a digital controlled oscillator.

Description of Related Art

A periodic signal is used for an operation of an internal circuit in a device, such as a memory device an Integrated Circuit (IC) chip, and a micro-controller. An oscillator may generate the periodic signal. An important thing in generating the periodic signal is that the periodic signal has an accuracy period which is set according to an intention of a designer. For example, when a period of the periodic signal is considerably changed by a Process, Voltage, and Temperature (PVT) condition and the like, it may be difficult to secure reliability of a device when the device is operated while being synchronized with the corresponding periodic signal. Accordingly, research on a design method for enabling an oscillator to generate an accurate periodic signal according to an intention of a designer has been conducted.

SUMMARY

The present disclosure has been made in an effort to solve the above-described problems associated with the prior art, and provides an oscillator which uses tri-state inverters, thereby improving performance and facilitating a design of the oscillator.

An exemplary embodiment of the present disclosure provides an oscillator including: a digital to analog converter configured to convert a control code into an analog voltage and output the analog voltage; a mirror circuit configured to adjust a current of a common output node to which the analog voltage is applied; and a periodic signal output circuit configured to output a periodic signal having a frequency according to the analog voltage, wherein at least one of the digital to analog converter, the mirror circuit, and the periodic signal output circuit is implemented with tri-state inverters.

Another exemplary embodiment of the present disclosure provides an oscillator including: a digital to analog converter including first tri-state inverters which output analog voltages having various frequencies through a common output node in response to a control code; a mirror circuit including at least one second tri-state inverter which controls a current of the common output node; and third tri-state inverters configured to output delay signals after a predetermined time delay in response to the analog voltage.

According to the exemplary embodiments of the present disclosure, it is possible to improve performance of an oscillator and facilitate a design of the oscillator.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements it can be the only element between the two elements, or one or more intervening elements may also be present. Like reference numerals refer to like elements throughout.

DETAILED DESCRIPTION

Advantages and features of the present disclosure and methods for achieving the advantages and features will be clear with reference to exemplary embodiments described in detail below together with the accompanying drawings. However, the present disclosure is not limited to the exemplary embodiments described herein and may be implemented in various different forms. However, the exemplary embodiments described herein are provided so as to describe the present disclosure in detail so that those skilled in the art may easily carry out the technical spirit of the present disclosure.

Throughout this specification and the claims that follow, when it is described that an element is "coupled" to another element, the element may be "directly coupled" to the other element or "electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Figure 1:
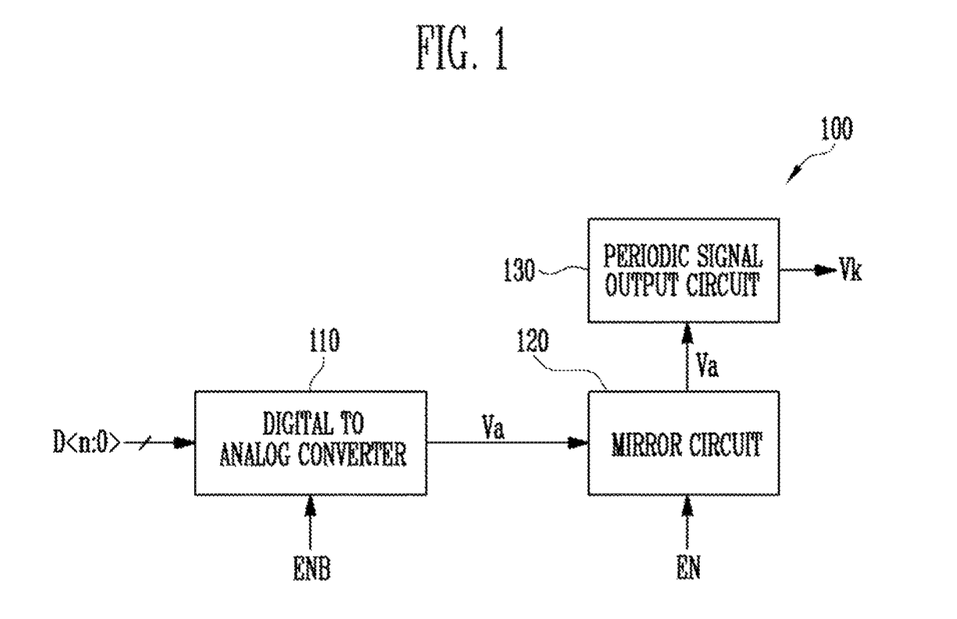
FIG. 1 is a block diagram illustrating an oscillator according to an exemplary embodiment of the present disclosure.

FIG. 1 is a block diagram illustrating an oscillator 100 according to an exemplary embodiment of the present disclosure.

Referring to FIG. 1, the oscillator 100 may be implemented with a digital controlled oscillator (DCO). The oscillator 100 may output a periodic signal Vk having a uniform period in response to a control code D<n:0> of n+1 bits. To this end, the oscillator 100 may include a digital to analog converter (DAC) 110, a mirror circuit 120, and a periodic signal output circuit 130.

The digital to analog converter 110 may receive and convert the control code D<n:0> into an analog voltage Va and output the converted analog voltage Va. For example, the digital to analog converter 110 may be operated in response to a reverse enable signal ENB, and may vary a frequency of the analog voltage Va in response to the control code D<n:0>. Particularly, the digital to analog converter 110 may be formed of inverters having various sizes to improve current resolution.

The mirror circuit 120 may uniformly maintain a current of a node to which the analog voltage Va is applied, in response to an enable signal EN.

The periodic signal output circuit 130 may output the periodic signal Vk having a frequency according to the analog voltage Va output through the mirror circuit 120.

In order to facilitate a design of the oscillator 100 and improve performance of the oscillator 100, all of the elements included in the digital to analog converter 110, the mirror circuit, and the periodic signal output circuit 130 may be implemented with tri-state inverters. The tri-state inverter will be described in detail below.

Figure 2:
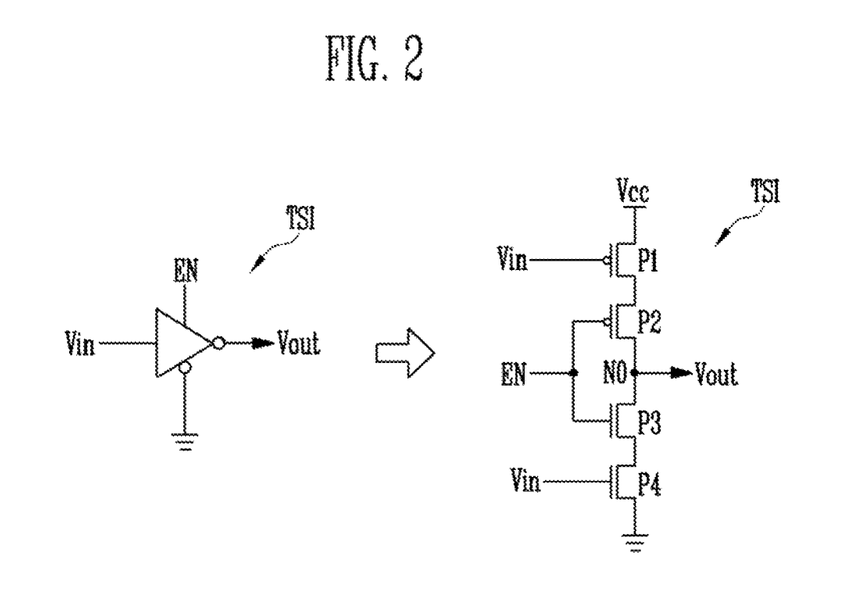
FIG. 2 is a circuit diagram for describing a tri-state inverter

FIG. 2 is a circuit diagram for describing a tri-state inverter.

Referring to FIG. 2, a tri-state inverter TSI may be operated according to an enable signal EN and when an input signal Vin is received, the tri-state inverter TSI may output an inversion signal Vout. Herein, the input signal Vin may be a signal or a code, and the inversion signal Vout may be a signal or a voltage. The tri-state inverter TSI may be formed of four transistors P1 to P4. For example, the tri-state inverter TSI may include first to fourth transistors P1 to P4 which are serially connected between a power supply terminal Vcc and a ground terminal. The first and second transistors P1 and P2 may be implemented with PMOS transistors, and the third and fourth transistors P3 and P4 may be implemented with NMOS transistors.

The input signal Vin may be applied to gates of the first and fourth transistors P1 and P4 at the same time, and the enable signal EN may be applied to the second and third transistors P2 and P3 at the same time. A node N0 between the second and third transistors P2 and P3 may be an output node of the tri-state inverter TSI, and the inversion signal Vout may be output through the output node N0.

Any one of the second and third transistor P2 and P3 may be turned on and the other may be turned off according to the enable signal EN. Accordingly, when the input signal Vin has a logic level which is the same as the enable signal EN, the tri-state inverter TSI may output the high or low inversion signal Vout.

For example, when the enable signal EN is high, the second transistor P2 is turned off and the third transistor P3 is turned on, and when the low input signal Vin is input, the first transistor P1 is turned on and the fourth transistor P4 is turned off. Accordingly, a current path is not formed between the power supply terminal Vcc and the output node N0, and a current path is also not formed between the output node N0 and the ground terminal even though the first transistor P1 is turned on. As a result, the inversion signal Vout is not output through the output node N0.

When both the enable signal EN and the input signal Vin are high, both the third and fourth transistors P3 and P4 are turned on and both the first and second transistors P1 and P2 are turned off. Accordingly, the output node N0 and the ground terminal are connected to each other and the low inversion signal Vout may be output. In contrast to this, when both the low enable signal EN and the low input signal Vin are input, the power supply terminal Vcc and the output node N0 may be connected to each other and the high inversion signal Vout may be output.

As described above, the tri-state inverter TSI may suppress a leakage current from being generated by the transistors which are turned on or off according to the input signal Vin and the enable signal EN, thereby stably outputting the inversion signal Vout. Accordingly, when a circuit is designed by using the tri-state inverter TSI, it is easy to digitalize the circuit.

Furthermore when all of the digital to analog converter 110, the mirror circuit 120, and the periodic signal output circuit 130 described with reference to FIG. 1 are implemented with the tri-state inverters TSI, a designer may easily design the oscillator by using a Hardware Description Language (HDL) code. Each of the digital to analog converter 110, the mirror circuit 120, and the periodic signal output circuit 130 using the tri-state inverter TSI will be described in detail.

Figure 3:
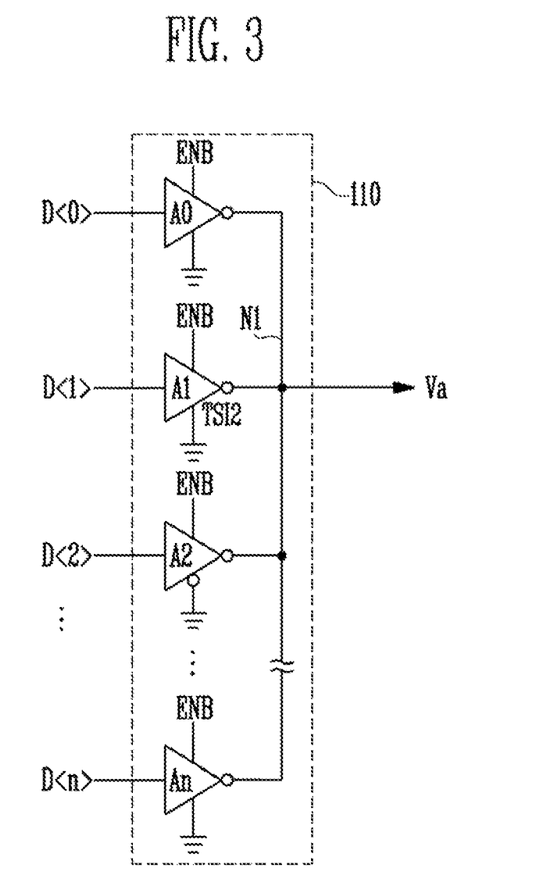
FIG. 3 is a detailed circuit diagram for describing a digital to analog converter shown in FIG. 1.

FIG. 3 is a detailed circuit diagram for describing the digital to analog converter 110 of FIG. 1.

Referring to FIG. 3, the digital to analog converter 110 may include a plurality of tri-state inverters TSI2. For example, the digital to analog converter 110 may include first to n+1$^{th}$ tri-state inverters A0 to An, where n is a positive integer, which are connected with each other in parallel. The first to n+1$^{th}$ tri-state inverters A0 to An may output the analog voltages Va through a common output node N1 in response to the inversion enable signal ENB and the control code D<n:0>. For example, the first to n+1$^{th}$ tri-state inverters A0 to An may commonly receive the inversion enable signal ENB that is the inversion signal of the enable signal EN applied to the mirror circuit 120, and vary a frequency of the analog voltage Va in response to the control code D<n:0>.

The digital to analog converter 110 may include the first to n+1$^{th}$ tri-state inverters A0 to An having various sizes in order to improve current resolution. For example, the first tri-state inverter A0 may be implemented with the smallest size, and a size may be gradually increased from the first tri-state inverter A0 to the n+1$^{th}$ tri-state inverter An. For example, when a size of the first tri-state inverter A0 is "1", the second tri-state inverter A1 may be implemented with a size of "2" that is larger than that of the first tri-state inverter A0 by two times, and the third tri-state inverter A2 may be implemented with a size of "3" that is larger than that of the first tri-state inverter A0 by three times. Herein, the sizes of the first to n+1$^{th}$ tri-state inverters A0 to An may be the sizes of the transistors included in the tri-state inverters, respectively. Herein, the sizes of the transistors may be lengths of channels of the transistors. The sizes of the transistors may be aspect ratio (W/L) of the transistors, indicating a ratio of width (W) to length (L) of a gate of each transistor For example, as described with reference to FIG. 2, one tri-state inverter TSI may include at least four transistors P1 to P4. The transistors P1 to P4 included in the same tri-state inverter TSI may be formed with the same size.

Referring back to FIG. 3, all of the transistors included in the first tri-state inverter A0 may be implemented with the transistors having a first size, and all of the transistors included in the second tri-state inverter A1 may be implemented with the transistors having a second size that is larger than the first size. Since the sizes of the first to n+1$^{th}$ tri-state inverters A0 to An are different from one another, the frequency of the analog voltage Va may be varied according to the control code D<n:0>. Further, a current and a voltage of the common output node N1 may be varied according to the control code D<n:0>. The current amount of the common output node N1 may be calculated from Equation 1 below.

$$I=(D<0>+2D<1>+3D<2>+\ldots+(n-1)D<N>)I\text{base} \quad \text{[Equation 1]}$$

Referring to Equation 1, "I" means the current amount of the common output node N1, and 'D<0>, D<1>, D2>, ... D<n>' may be "1" or "0" according to the control code D<n:0>. "Ibase" means the basic current amount of the common output node N1, the basic current may be the current of the common output node N1 when the inversion enable signal ENB is "1". '2D<1>' means a value larger than a value of 'D<0>' by two times. For example, when both D<0> and D<1> among the control code D<n:0> are "0", D<0> becomes "0" and 2D<1> becomes 2. Accordingly, it is possible to finely adjust the frequency of the analog voltage Va and the current amount of the common output node N1 according to the control code D<n:0>.

Figure 4:
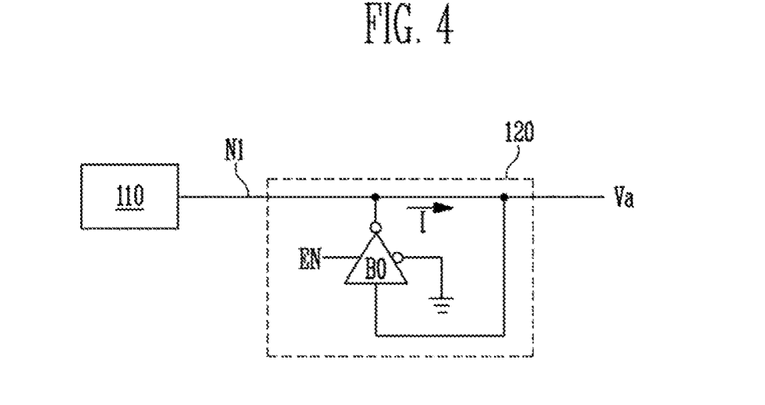
FIG. 4 is a detailed circuit diagram for describing a mirror circuit shown in FIG. 1.

FIG. 4 is a detailed circuit diagram for describing the mirror circuit 120 of FIG. 1.

Referring to FIG. 4, the mirror circuit 120 may be formed to uniformly maintain the current amount of the common output node N1. The mirror circuit 120 may include one or more tri-state inverters B0. For example, the tri-state inverter B0 may feedback the analog voltage Va to the common output node N1 and uniformly maintain the amount of current I of the common output node N1 according to the enable signal EN and the analog voltage Va.

Figure 5:
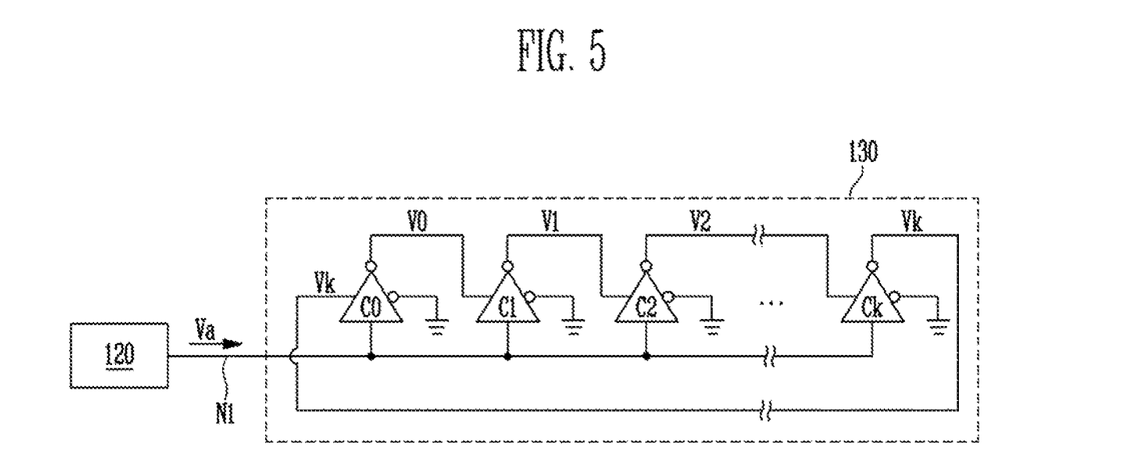
FIG. 5 is a detailed circuit diagram for describing a periodic signal output circuit shown in FIG. 1.

FIG. 5 is a detailed circuit diagram or describing the periodic signal output circuit 130 of FIG. 1.

Referring to FIG. 5, the periodic signal output circuit 130 may be formed to output the periodic signal Vk after a predetermined time delay in response to the analog voltage Va output through the mirror circuit 120. The periodic signal output circuit 130 may include first to k+1$^{th}$ tri-state inverters C0 to Ck, where k is a positive integer.

The first to k+1$^{th}$ tri-state inverters C0 to Ck included in the periodic signal output circuit 130 may commonly receive the analog voltage Va applied to the common output node N1 as an input signal. Further, each of the first to k+1$^{th}$ tri-state inverters C0 to Ck may receive an output signal of the tri-state inverter of a previous turn as its enable signal, and output its output signal to the tri-state inverter of a next turn. Since the first to k+1$^{th}$ tri-state inverters C0 to Ck form a closed loop in which the last tri-state inverter is coupled to the first tri-state inverter, the first tri-state inverter may receive the output signal of the last tri-state inverter as an enable signal. For example, the first to k+1$^{th}$ tri-state inverters C0 to Ck may commonly receive the analog voltage Va as an input signal the first tri-state inverter C0 may receive the periodic signal Vk output from the k+1$^{th}$ tri-state inverter Ck as an enable signal, and each of the second to k+1$^{th}$ tri-state inverters C1 to Ck may receive an output signal of the tri-state inverter of a previous turn as its enable signal. The analog voltage Va is varied according to the control code D<n:0>, so that the periodic signal output circuit 130 may output the periodic signal Vk having a specific frequency according to the analog voltage Va.

More particularly, the first tri-state inverter C0 may output a first signal V0 in response to the analog voltage Va and the periodic signal Vk. The first signal V0 may be used as an enable signal of the second tri-state inverter C1. The second tri-state inverter C1 may output a second signal V1 in response to the analog voltage V1 and the first signal V0. By the method, the k+1$^{th}$ tri-state inverter Ck may output the periodic signal Vk having a specific frequency in response to the analog voltage Va and a k$^{th}$ signal Vk–1. A delay time of the periodic signal Vk may be adjusted according to the number of tri-state inverters C0 to Ck, and to this end, the odd-number of first to k+1$^{th}$ tri-state inverters C0 to Ck may be included in the periodic signal output circuit 130.

Operations of the digital to analog converter 110, the mirror circuit 120, and the periodic signal output circuit 130 described with reference to FIGS. 3 to 5, respectively, will be described in detail below.

Figure 6:
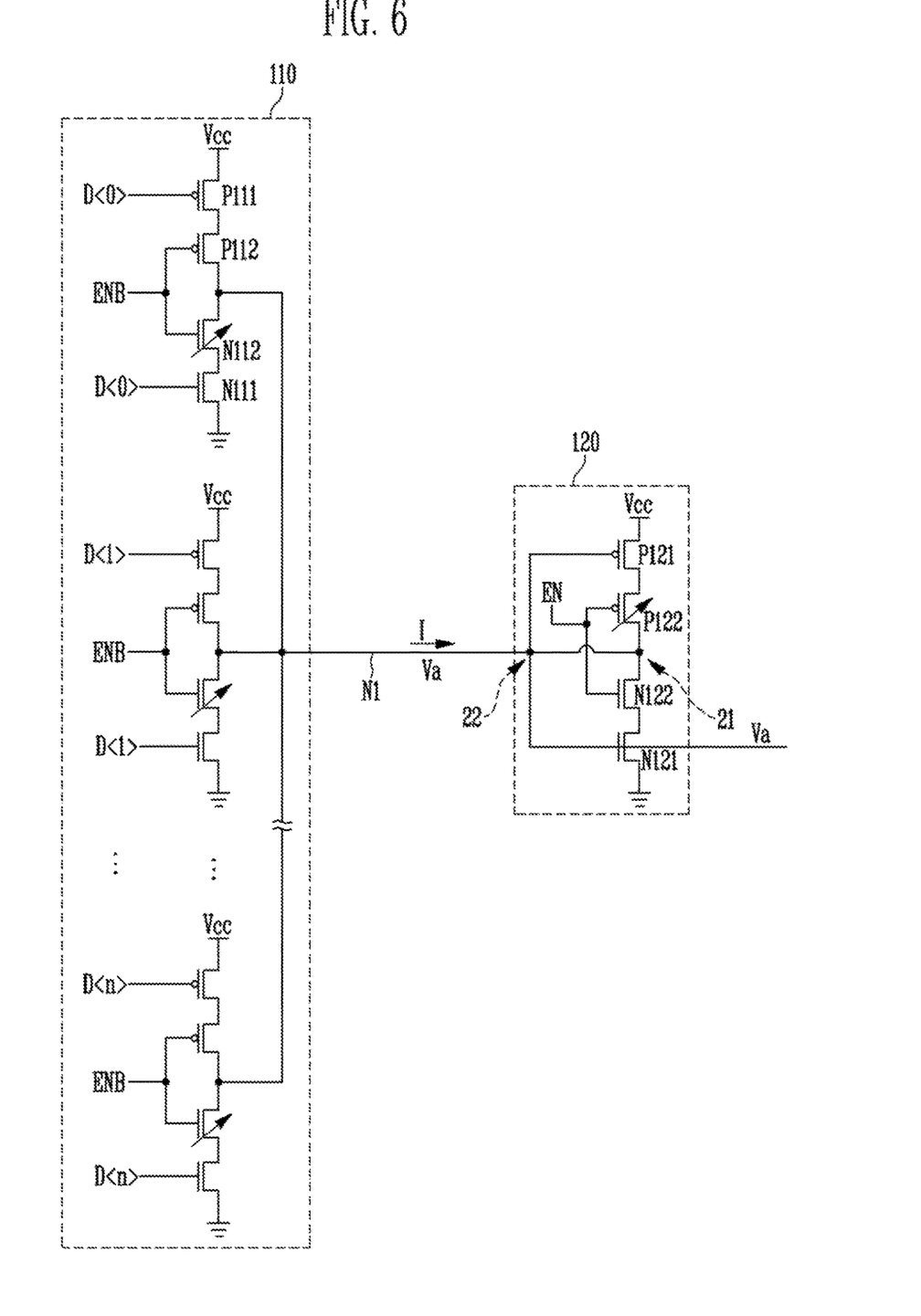
FIG. 6 is a circuit diagram for describing operations of the digital to analog converter and the mirror circuit.

FIG. 6 is a circuit diagram for describing operations of the digital to analog converter 110 and the mirror circuit 120. In FIG. 6, for a detailed operation description, each tri-state inverter is illustrated with a transistor level.

Referring to FIG. 6, when the oscillator 100 is operated, the high enable signal EN may be applied to the mirror circuit 120, and the low inversion enable signal ENB may be applied to the digital to analog converter 110. The tri-state inverters included in the digital to analog converter 110 may block the current path connected to the ground terminal in response to the low inversion enable signal ENB. For example, each of the tri-state inverters included in the digital to analog converter 110 may include PMOS transistors P111 and P112 which are serially connected between a power supply terminal Vcc and the common output node N1, and NMOS transistors N111 and N112 which are serially connected between the ground terminal and the common output node N1. Among the NMOS transistors N111 and N112 included in the tri-state inverter, all of the NMOS transistors N112, in which the low inversion enable signal ENB is applied to gates, are turned off, and all of the PMOS transistors P112 in which the low inversion enable signal ENB is applied to gates, are turned on. Accordingly, when the inversion enable signal ENB is low, the digital to analog converter 110 may output the analog voltage Va of the high level in response to bits of to "0" among the control code D<n:0>. Herein, the bits of "0" means a low signal. The analog voltage Va may be varied according to the control code D<n:0>.

The mirror circuit 120 may adjust the current I of the common output node N1 in response to the high enable signal EN. For example, the mirror circuit 120 may mirror an output node and an input node and uniformly maintain the current amount of the common output node N1. To this end, the mirror circuit 120 may include at least one tri-state inverter. In the mirror circuit 120, an output node 21 and an input node 22 of the tri-state inverter may be connected to each other in order to mirror the currents of the input node and the output node. The input node 22 and the output node 21 may be connected to the common output node N1 to which the analog voltage Va is applied. For example, the enable signal EN may be applied to gates of a PMOS transistor P122 and an NMOS transistor N122 of the tri-state inverter, and the output node 21 and the input node 22 may be commonly connected to gates of a PMOS transistor P121 and an NMOS transistor N121 of the tri-state inverter, which are different from the transistors P122 and N122 having the gates to which the enable signal EN is applied. Herein, a drain of the PMOS transistor P121 may be connected to the power supply terminal Vcc, and a source of the NMOS transistor N121 may be connected to the ground terminal A common node in which the PMOS transistor P122 and the NMOS transistor N122 are connected to each other is the output node 21.

When the enable signal EN is high, the PMOS transistor P122 is turned off, and the NMOS transistor N122 is turned on. In this case, when the analog voltage Va is applied to the mirror circuit 120, the NMOS transistor N121 of the mirror circuit 120 is turned on according to the level of the analog voltage Va. Accordingly, a current path may be formed between the common output node N1 and the ground terminal. As described above the mirror circuit 120 may make a constant current flow in the common output node N1, thereby stably supplying the analog voltage Va to the periodic signal output circuit 130.

Figure 7:
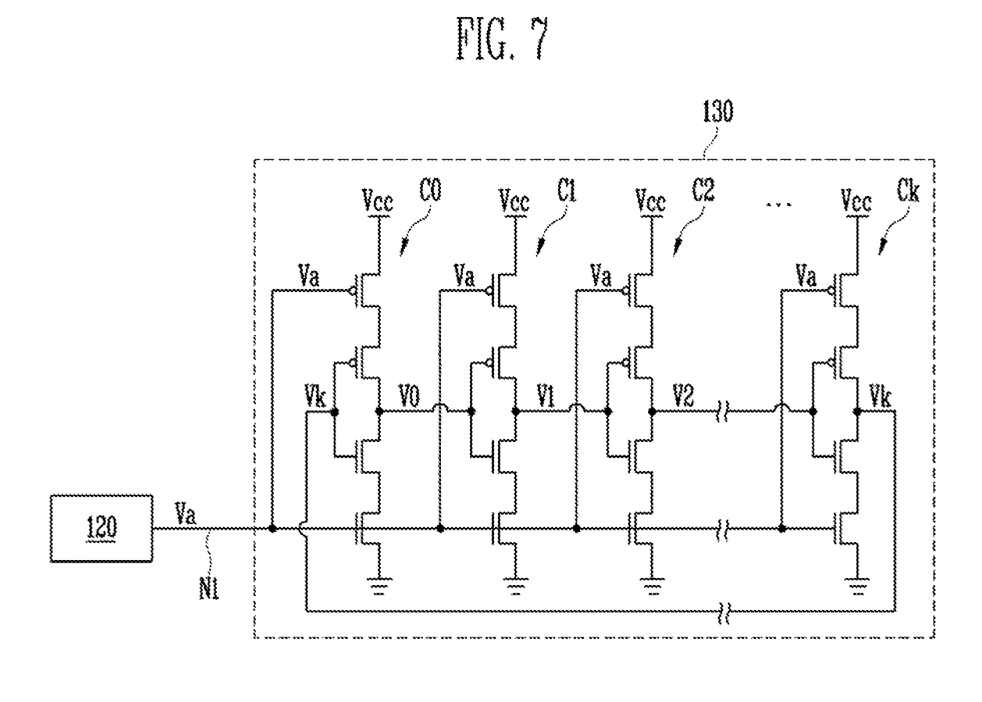
FIG. 7 is a circuit diagram for describing an operation of the periodic signal output circuit.

FIG. 7 is a circuit diagram for describing an operation of the periodic signal output circuit 130.

Referring to FIG. 7, the periodic signal output circuit 130 may rapidly output a frequency of the periodic signal Vk in proportion to the current amount of the common output node N1. For example, the periodic signal output circuit 130 may include first to k+1$^{th}$ tri-state inverters C0 to Ck. The first to k+1$^{th}$ tri-state inverters C0 to Ck are connected to one another in serial and receive the analog voltage Va as an input signal. Each of the first to k+1$^{th}$ tri-state inverters C0 to Ck may be operated by receiving an output signal output from the tri-state inverter of a previous turn as an enable signal. For example, the first tri-state inverter C0 may receive the periodic signal Vk output from the k+1$^{th}$ tri-state inverter Ck of the last turn as an enable signal, and receive the analog voltage Va as an input signal to output the first signal V0. The output node of the k+1$^{th}$ tri-state inverter Ck from which the periodic signal Vk is output, may be initialized to be high or low, and may be differently initialized according to the oscillator 100. The first signal V0, the second signal V1, . . . and the periodic signal Vk may be sequentially output according to the analog voltage Va. For example, the first signal V0 may be output to be low when both the periodic signal Vk and the analog voltage Va are high, and the first signal V0 may be output to be high when both the periodic signal Vk and the analog voltage Va are low. The first to k+1$^{th}$ tri-state inverters C0 to Ck are operated by the manner described above, so that the periodic signal Vk having a specific frequency may be output.

Figure 8:
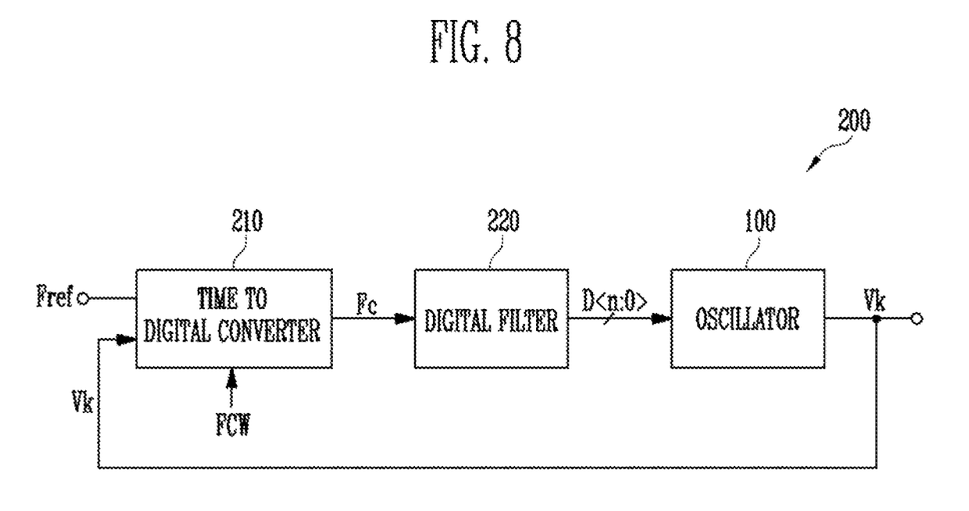
FIG. 8 is a block diagram illustrating a digital phase locked loop in accordance with to an embodiment of the present disclosure.

FIG. 8 is a block diagram illustrating a digital phase locked loop 200 according to an exemplary embodiment of the present disclosure.

Referring to FIG. 8, there is the digital phase locked loop 200 as an exemplary embodiment in which the oscillator 100 is used. The digital phase locked loop 200 may output a periodic signal Vk having a high frequency according to a reference frequency Fref. For example, the digital phase locked loop 200 may include a Time to Digital Converter (TDC) 210, a digital filter 220, and the oscillator 110. The TDC 210 may be synchronized with the reference frequency Fref and output a frequency phase difference value Fc according to a Frequency Control Word (FCW) and the periodic signal Vk. The digital filter 220 may remove a noise of the frequency phase difference value Fc and output the control code D<n:0>. The oscillator 100 has been described with reference to FIG. 1, so that a detailed description thereof will be omitted.

It is possible to easily design various devices including the oscillator 100 by facilitating a design of the oscillator 100 as described to above.

In the detailed description of the present disclosure, the particular exemplary embodiments have been described, but various modifications are available within the scope without departing from the scope and the technical spirit of the present disclosure. Therefore, the scope of the present disclosure shall not be limited to the exemplary embodiments described, but shall be defined by the claims to be described below and the equivalents to the claims.

What is claimed is:

1. An oscillator comprising:
a digital to analog converter configured to convert a control code into an analog voltage and output the analog voltage;
a mirror circuit configured to adjust a current of a common output node to which the analog voltage is applied; and
a periodic signal output circuit configured to output a periodic signal having a frequency according to the analog voltage,
wherein at least one of the digital to analog converter and the mirror circuit is implemented with tri-state inverters.

2. The oscillator of claim 1, wherein the digital to analog converter includes a plurality of inverters each of which receives the control code and outputs the analog voltage to the common output node.

3. The oscillator of claim 2, wherein the inverters are implemented with the tri-state inverters.

4. The oscillator of claim 3, wherein each of the tri-state inverters included in the digital to analog converter includes:
first and second PMOS transistors which are serially connected between a power supply terminal and the common output node; and
first and second NMOS transistors which are serially connected between a ground terminal and the common output node.

5. The oscillator of claim 4, wherein the second PMOS and NMOS transistors have gates receiving a first enable signal, and the first PMOS and NMOS transistors have gates receiving the control code.

6. The oscillator of claim 3, wherein the tri-state inverters included in the digital to analog converter are implemented with different sizes.

7. The oscillator of claim 1, wherein the mirror circuit is implemented with the tri-state inverter, and
an input node and an output node of the tri-state inverter included in the mirror circuit are commonly connected to the common output node.

8. The oscillator of claim 7, wherein the tri-state inverter included in the mirror circuit includes:
first and second PMOS transistors which are serially connected between a power supply terminal and the common output node; and
first and second NMOS transistors which are serially connected between a ground terminal and the common output node, and
a gate of the first PMOS transistor, a gate of the first NMOS transistor, and the output node are commonly connected to the common output node.

9. The oscillator of claim 8, wherein the second PMOS and NMOS transistors have gates receiving a second enable signal that is an inversion signal of a first enable signal applied to the digital to analog converter.

10. The oscillator of claim 1, wherein the periodic signal output circuit is implemented with the tri-state inverters which commonly receive the analog signal as an input signal.

11. The oscillator of claim 10, wherein each of the tri-state inverters included in the periodic signal output circuit includes:
first and second PMOS transistors which are serially connected between a power supply terminal and the common output node; and
first and second NMOS transistors which are serially connected between a ground terminal and the common output node.

12. The oscillator of claim 11, wherein the second PMOS and NMOS transistors have gates receiving a signal output from the tri-state inverter of a previous turn, and the first PMOS and NMOS transistors have gates receiving the analog voltage.

13. The oscillator of claim 12, wherein an output signal output from the tri-state inverter of the last turn is applied to the gates of the second PMOS and NMOS transistors included in the first tri-state inverter among the tri-state inverters included in the periodic signal output circuit.

14. An oscillator comprising:
a digital to analog converter including first tri-state inverters which output analog voltages corresponding to various frequencies through a common output node in response to a control code;
a mirror circuit including at least one second tri-state inverter which controls a current of the common output node; and
third tri-state inverters configured to output delay signals after a predetermined time delay in response to the analog voltages.

15. The oscillator of claim 14, wherein the control code is applied to each of input nodes of the first tri-state inverters, and output nodes of the first tri-state inverters are commonly connected to the common output node.

16. The oscillator of claim 14, wherein the tri-state inverters included in the first tri-state inverters are implemented with different sizes.

17. The oscillator of claim 16, wherein the sizes are differently set according to lengths of channels of transistors included in the tri-state inverters.

18. The oscillator of claim 14, wherein the second tri-state inverter is operated in response to an inversed enable signal of an enable signal applied to the digital to analog converter.

19. The oscillator of claim 18, wherein the second tri-state inverter is formed such that an input node is connected with an output node.

20. The oscillator of claim 14, wherein the third tri-state inverters are formed such that an output signal of a previous tri-state inverter is used as an enable signal of a next tri-state inverter.

* * * * *